(12) United States Patent
Yang et al.

(10) Patent No.: US 11,930,624 B2
(45) Date of Patent: Mar. 12, 2024

(54) ELECTRONIC DEVICE PROTECTING CASING WITH HEATING FUNCTION

(71) Applicants: Sampson Yang, New Taipei (TW); Yun-Chang Tsui, New Taipei (TW); Jui-Lin Wu, New Taipei (TW)

(72) Inventors: Sampson Yang, New Taipei (TW); Yun-Chang Tsui, New Taipei (TW); Jui-Lin Wu, New Taipei (TW)

(73) Assignee: THE JOY FACTORY, INC., Irvine, CA (US)

( * ) Notice: Subject to any disclaimer, the term of this patent is extended or adjusted under 35 U.S.C. 154(b) by 230 days.

(21) Appl. No.: 17/691,140

(22) Filed: Mar. 10, 2022

(65) Prior Publication Data
US 2023/0292467 A1    Sep. 14, 2023

(51) Int. Cl.
  *G06F 1/16*       (2006.01)
  *H05K 7/20*       (2006.01)
(52) U.S. Cl.
  CPC ......... *H05K 7/2039* (2013.01); *G06F 1/1628* (2013.01)
(58) Field of Classification Search
  CPC .... G06F 1/1628; G06F 1/1632; G06F 1/1656; H04B 1/3888; H04M 1/0283
  See application file for complete search history.

(56) References Cited

U.S. PATENT DOCUMENTS

| | | | | |
|---|---|---|---|---|
| 4,162,695 A | * | 7/1979 | Moses | A45C 13/18 219/211 |
| 7,612,997 B1 | * | 11/2009 | Diebel | H04M 1/0262 361/679.41 |
| 7,618,065 B2 | * | 11/2009 | Yau | B42D 3/123 361/679.56 |
| 7,889,498 B2 | * | 2/2011 | Diebel | G06F 1/1628 361/679.41 |
| D691,124 S | * | 10/2013 | Yang | H04B 1/3888 D14/250 |
| D697,060 S | * | 1/2014 | Yang | D14/250 |
| D697,504 S | * | 1/2014 | Yang | G06F 1/1626 D14/250 |
| 9,204,697 B2 | * | 12/2015 | Yang | A45C 11/00 |
| 10,993,335 B1 | * | 4/2021 | Tsui | G06F 1/1626 |
| 11,703,911 B2 | * | 7/2023 | Mochizuki | G06F 1/1626 361/679.01 |

(Continued)

FOREIGN PATENT DOCUMENTS

CN      209823830 U  * 12/2019

*Primary Examiner* — Adrian S Wilson (57) ABSTRACT

An electronic device protecting casing with heating function includes: a casing; a battery box within the casing; an interior of the battery box being arranged with a battery, a back side of the battery box being formed with an opening for receiving the battery; an outer cover serving to seal the opening; an inner side of the outer cover being formed with a heat isolation sheet; a heating unit being installed within the casing for heating the tablet computer; the heating unit including an electric heating plate. When power of the battery is transferred to the electric heating plate, the electric heating plate generates heat power and then transfers the power to the tablet computer for heating it; and a control circuit is installed within the casing; the electric heating plate is connected to the battery through a control switch; and the control circuit is connected to the control switch.

16 Claims, 10 Drawing Sheets

(56) References Cited

U.S. PATENT DOCUMENTS

| | | | | |
|---|---|---|---|---|
| 2002/0147035 | A1* | 10/2002 | Su | H04M 1/72403 320/106 |
| 2004/0097256 | A1* | 5/2004 | Kujawski | H04M 1/724092 455/550.1 |
| 2005/0127056 | A1* | 6/2005 | Petkov | A45C 15/00 219/211 |
| 2006/0058073 | A1* | 3/2006 | Kim | H04B 1/3877 455/573 |
| 2006/0169608 | A1* | 8/2006 | Carnevali | G06F 1/1626 206/320 |
| 2007/0101039 | A1* | 5/2007 | Rutledge | G06F 1/1632 710/303 |
| 2007/0139873 | A1* | 6/2007 | Thomas | G06F 1/182 361/679.56 |
| 2007/0152633 | A1* | 7/2007 | Lee | G06F 1/1632 320/114 |
| 2007/0247793 | A1* | 10/2007 | Carnevali | G06F 1/1656 361/679.1 |
| 2008/0007214 | A1* | 1/2008 | Cheng | H02J 7/0044 320/114 |
| 2008/0053770 | A1* | 3/2008 | Tynyk | A45C 11/00 429/96 |
| 2008/0096620 | A1* | 4/2008 | Lee | H04B 1/3888 455/575.8 |
| 2009/0114556 | A1* | 5/2009 | Tai | H05K 5/0226 206/320 |
| 2009/0114633 | A1* | 5/2009 | Naylor | H05B 3/36 219/528 |
| 2009/0286575 | A1* | 11/2009 | Taniguchi | H04M 1/0247 455/566 |
| 2009/0312058 | A9* | 12/2009 | Wood | H04M 1/605 455/575.8 |
| 2010/0078343 | A1* | 4/2010 | Hoellwarth | B29C 45/14639 206/320 |
| 2010/0087089 | A1* | 4/2010 | Struthers | H04R 27/00 439/533 |
| 2010/0087099 | A1* | 4/2010 | Fadell | H04M 1/72409 439/669 |
| 2010/0195279 | A1* | 8/2010 | Michael | G06F 1/1632 361/679.41 |
| 2011/0267757 | A1* | 11/2011 | Probst | G06F 1/1681 361/679.09 |
| 2012/0154991 | A1* | 6/2012 | Lei | H04M 1/0254 361/679.01 |
| 2013/0030600 | A1* | 1/2013 | Shetty | F24F 11/62 236/1 C |
| 2013/0220841 | A1* | 8/2013 | Yang | B63C 11/02 206/37 |
| 2014/0262847 | A1* | 9/2014 | Yang | F16M 13/022 206/37 |
| 2014/0347000 | A1* | 11/2014 | Hamann | G06F 1/189 361/679.56 |
| 2014/0362518 | A1* | 12/2014 | Huang | G06F 1/206 361/679.46 |
| 2015/0136819 | A1* | 5/2015 | Yang | A45C 11/00 224/191 |
| 2016/0330861 | A1* | 11/2016 | Moore | G11B 33/1426 |
| 2017/0300093 | A1* | 10/2017 | Hamann | G06F 1/189 |
| 2017/0311389 | A1* | 10/2017 | Anderson, Jr. | G06F 1/1628 |
| 2021/0328614 | A1* | 10/2021 | Shearer | H04B 1/3888 |
| 2022/0121242 | A1* | 4/2022 | Mochizuki | G06F 1/1658 |

* cited by examiner

ELECTRONIC DEVICE PROTECTING CASING WITH HEATING FUNCTION

FIELD OF THE INVENTION

The present invention is related to electronic device protecting casings, and in particular to an electronic device protecting casing with heating function.

BACKGROUND OF THE INVENTION

Prior art protection casings of a tablet computer are mainly used to enclose tablet computers for isolating the tablet computer from environments and thus it has the functions of waterproof and avoiding undesired objects to enter into the tablet computer. A general tablet computer must be operated normally within a preset temperature range, this is because too low temperature will cause that the tablet computer cannot operate normally so as to affect the functions thereof.

However, a prior art protection casing of a tablet computer cannot keep it within operation temperature and thus the tablet computer contained therein does not retain in operation temperatures. As a result, external heating devices are used for heating the tablet computers, while the heating devices must be brought further. This will increase the cost and is inconvenient as the tablet computer is carried out. Furthermore, the heating device cannot well fix within the protecting casing. The protection casing often has a preset thickness, which causes that the heating device must provide more power to warm the tablet computer, causing that the overall efficiency is down.

The present invention is aimed to provide a novel protection casing of a tablet computer which has the function of heating the tablet computer to achieve the problem above mentioned.

SUMMARY OF THE INVENTION

Accordingly, the object of the present invention is to provide a electronic device protecting casing with heating function, wherein an electric heating plate, a temperature sensor and a battery are integrated to the protecting casing of the tablet computer. When the temperature sensor detects that the temperature of the tablet computer is lower than a set value, the control circuit will actuate the electric heating plate to heat the tablet computer. As a result, the tablet computer and the battery can be operated in proper temperature for avoiding the tablet computer not to operate due to too lower temperature. Therefore, by using the protection casing of the present invention, the tablet computer can operate even in lower temperature environment. In the present invention, the electric heating plate, the temperature sensor and the battery are integrated to the protecting casing of the tablet computer so as to have an optimum heating efficiency. Furthermore, the structure of the present invention is portable easily. Moreover, a heat switch is arranged to cause that the present invention is used conveniently. Users do not need to further equip extra heating devices. The overall costs are down.

To achieve above object, the present invention provides a An electronic device protecting casing with heating function, comprising: a casing for receiving a tablet computer therein; the casing including a front cover and a back cover; the front cover being combined with the back cover, the tablet computer being received therein; a battery box located within the casing; an interior of the battery box is arranged with a battery, a rear side of the battery box exposes out of an outer side of the back cover; a back side of the battery box being formed with an opening for receiving the battery; an outer cover serving to seal the opening; an inner side of the outer cover being formed with a heat isolation sheet for preventing heat generated the battery from escape; a heating unit being installed within the casing for heating the tablet computer; one side of the heating unit being in contact with the tablet computer; the heating unit including an electric heating plate which is connected to the battery; when power of the battery is transferred to the electric heating plate, the electric heating plate generates heat power and then transfers the power to the tablet computer for heating it; and a control circuit installed within the casing; the electric heating plate is connected to the battery through a control switch; the control circuit is connected to the control switch; the control circuit serves to control the control switch for opening or closing current flowing between the battery and the electric heating plate so as to control the heat generation of the electric heating plate; therefore, the control circuit can control temperature of the electric heating plate.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 1 to 10, the structure of the present invention is illustrated. The present invention includes the following elements.

Figure 1:
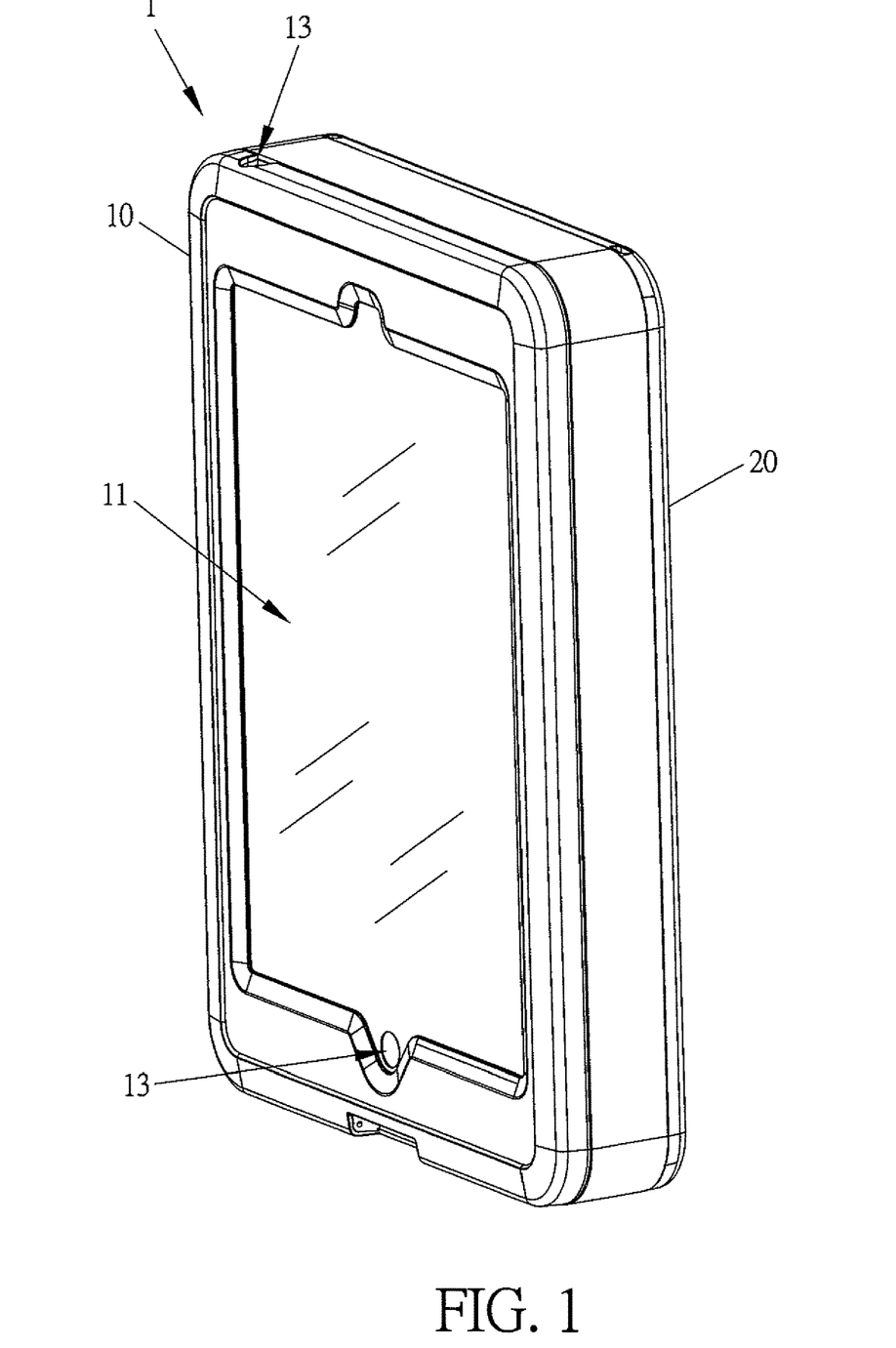
FIG. 1 is an assembly schematic view showing the elements of the present invention.
Figure 3:
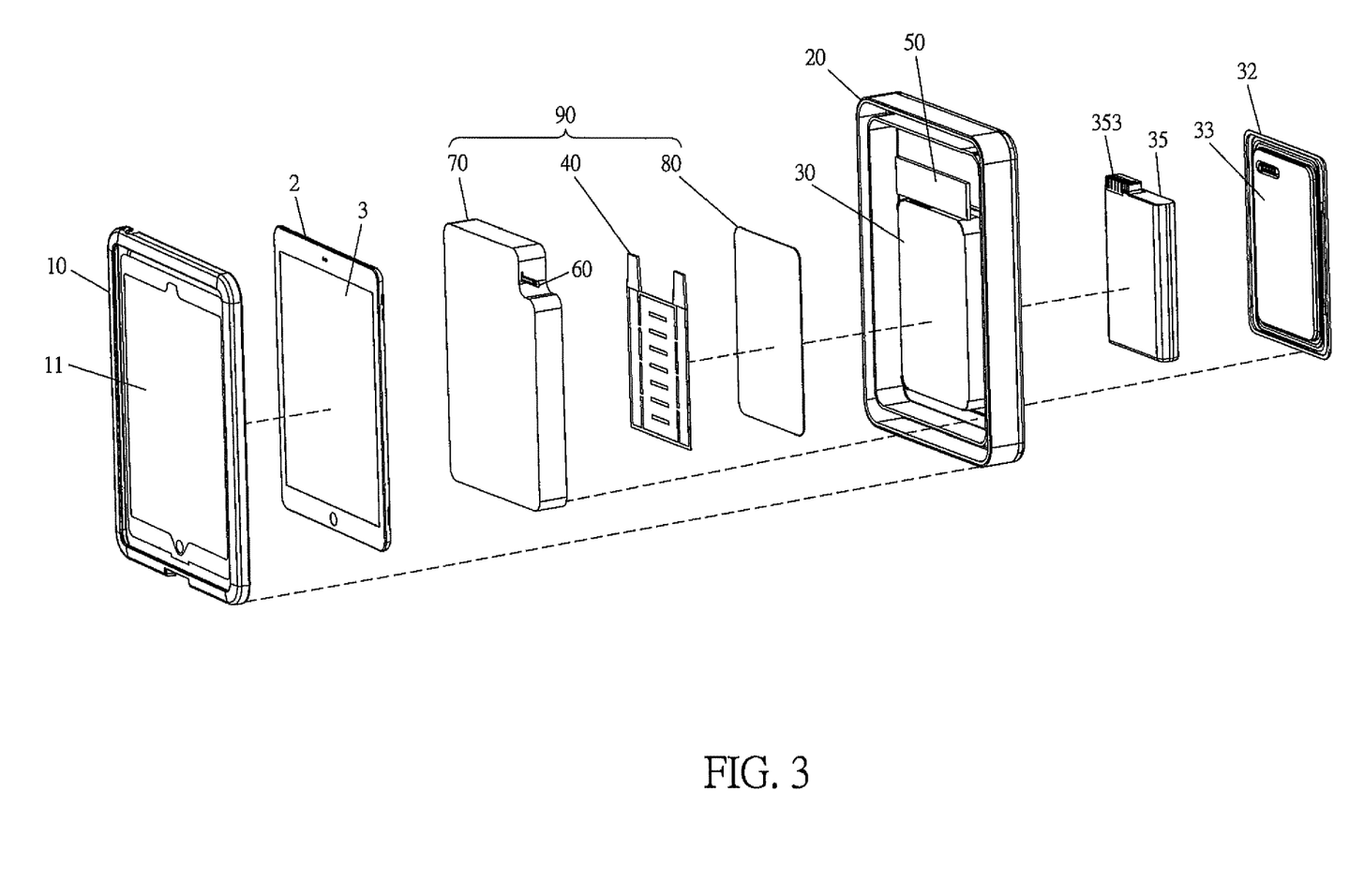
FIG. 3 is an exploded view of the present invention.

A casing 1 serves to receive a tablet computer 2 therein. The casing 1 is a rectangular casing and includes a front cover 10 and a back cover 20. When the front cover 10 is combined with the back cover 20, the tablet computer 2 can be received therein. Referring to FIGS. 1 and 3, it is illustrated that the front cover 10 is formed with a transparent portion 11 which is corresponding to a position of a screen of the tablet computer 2 so that a user can view the screen. In use, the tablet computer 2 is retained within the front cover 10. The front cover 10 may fix the tablet computer 2 by bucking, embedding, and other ways. The front cover 10 is combined to the back cover 20 by screwing or bucking or other ways. In this example, lateral sides of the front cover 10 and the back cover 20 are formed with various screwing holes 16 so that screws can lock the front cover 10 to the back cover 20.

Figure 2:
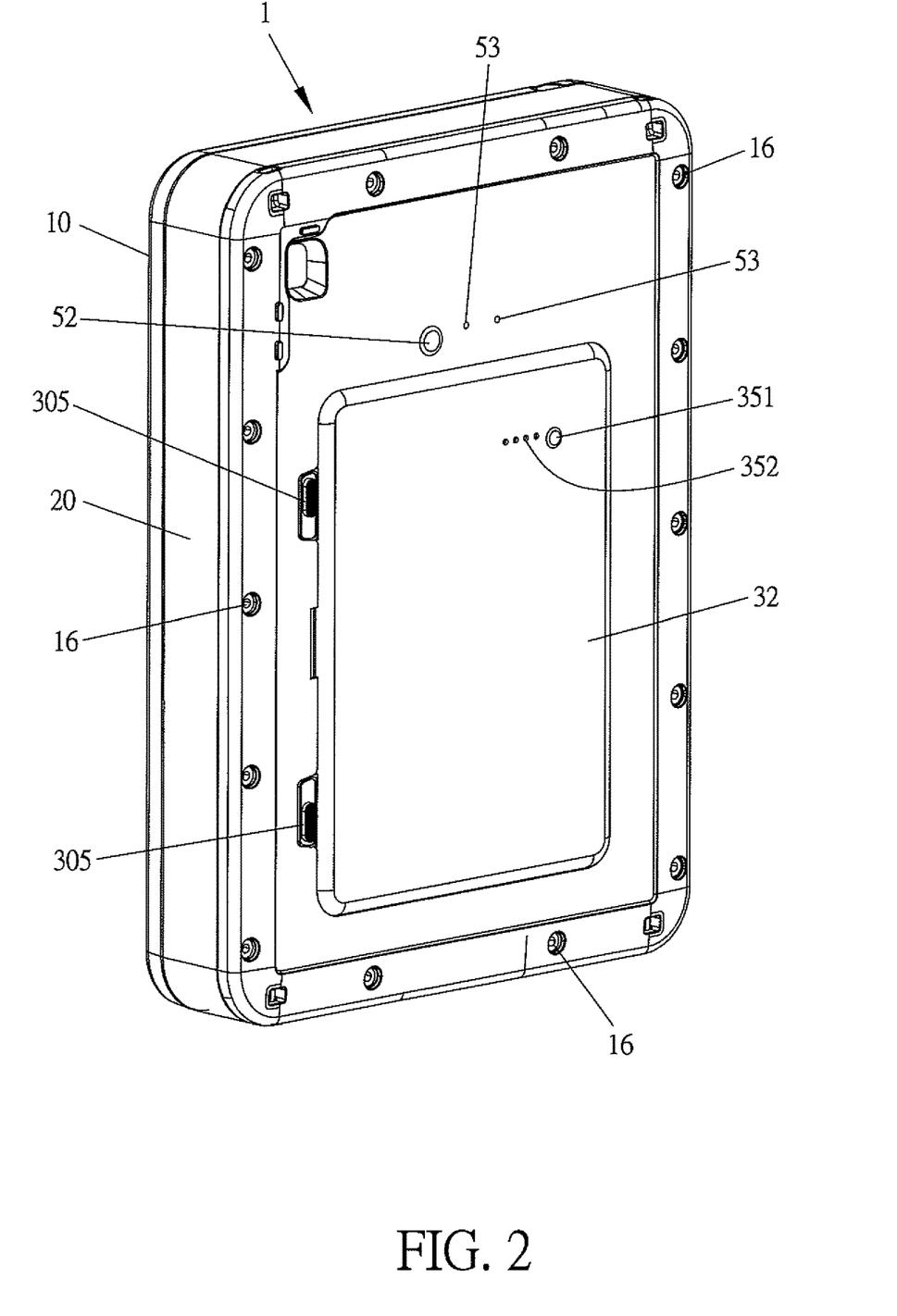
FIG. 2 is a rear schematic view of the present invention.
Figure 4:
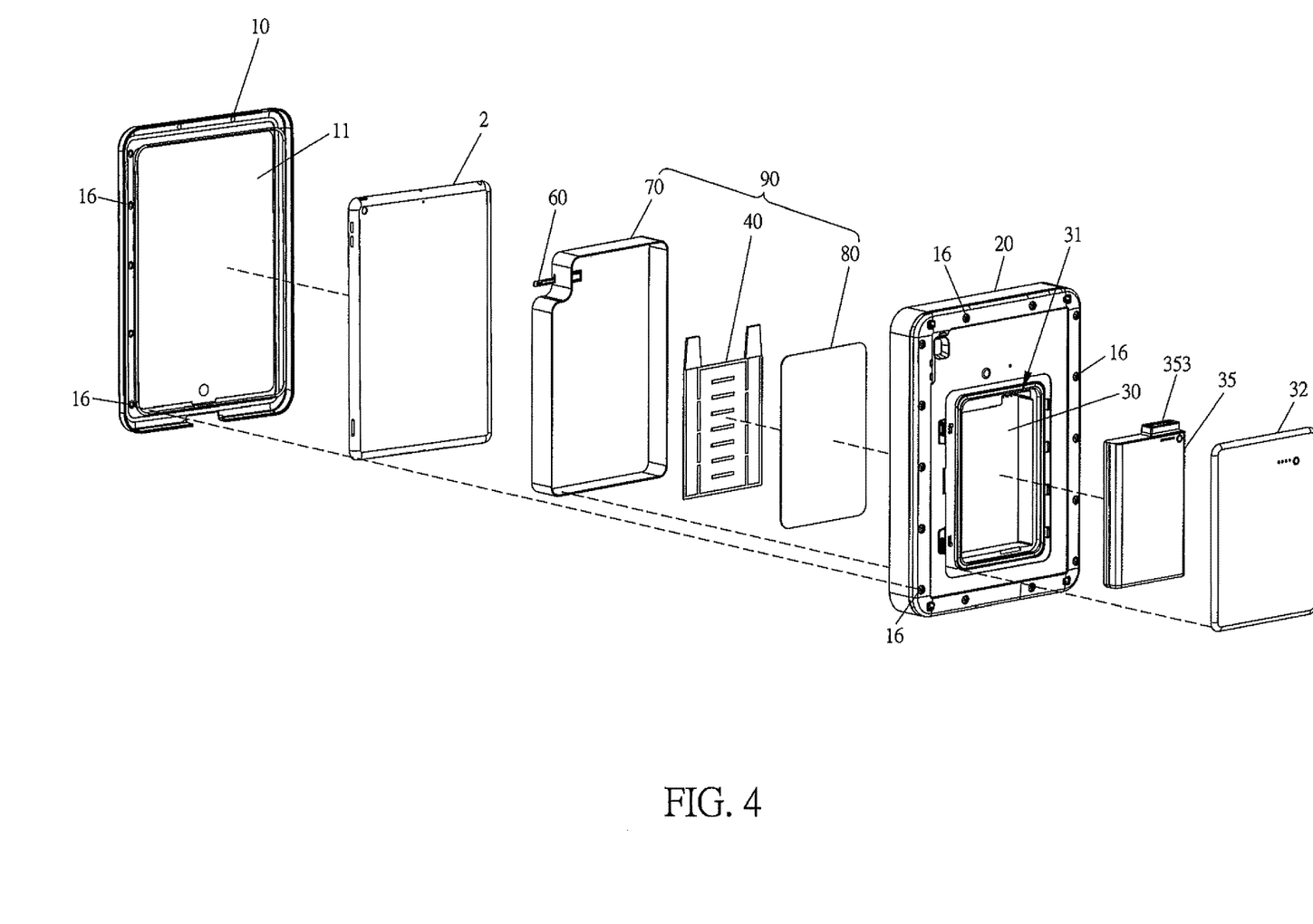
FIG. 4 is a rear side view of the drawing shown in FIG. 3.

A battery box 30 is located within the casing 1. An interior of the battery box 30 is arranged with a battery 35. As illustrated in FIGS. 2 and 4, a rear side of the battery box 30 exposes out of an outer side of the back cover 20. A back side of the battery box 30 is formed with an opening 31 for receiving the battery 35. An outer cover 32 serves to seal the opening 31. An inner side of the outer cover 32 is formed with a heat isolation sheet 33 for preventing heat generated by the battery from escape.

Figure 7:
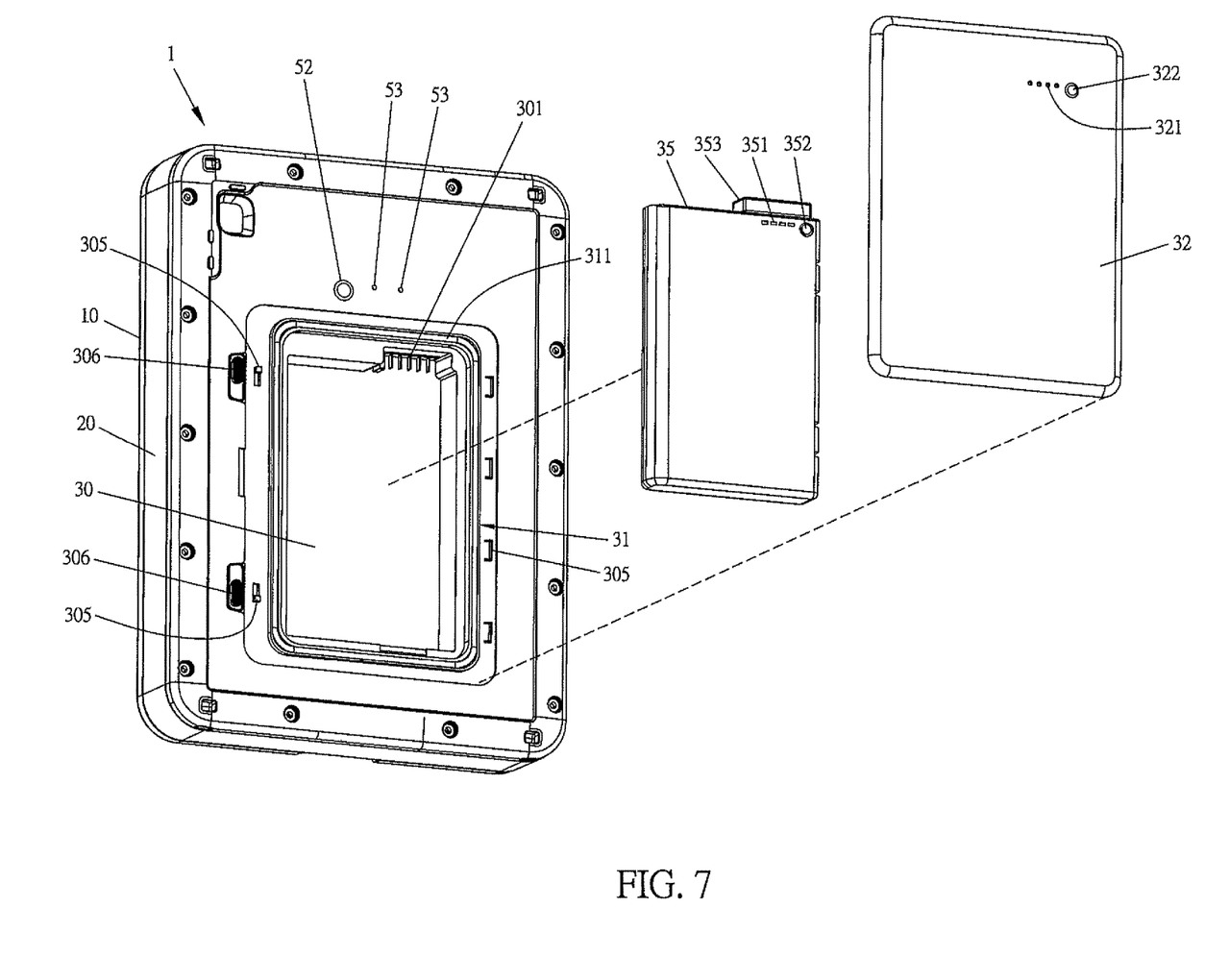
FIG. 7 is an exploded schematic view showing the outer cover, battery and back cover of the present invention.

Referring to FIG. 7, a back side of the battery 35 is installed with a power indicator 351 and a battery switch 352. The power indicator 351 serves to show the power level of the battery 35. The battery switch 352 serves to open or close the power indicator 351. The outer cover 32 is formed with a light transparent portion 321 at a position corresponding to that of the power indicator 351. The outer cover 32 is arranged with an outer cover switch 322 at a position corresponding to that of the battery switch 352. Therefore, a user may view the power indicator 351 of the battery 35 through the light transparent portion 321 and press the battery switch 352 through the outer cover switch 322.

A heating unit 90 is installed within the casing 1 for heating the tablet computer 2. One side of the heating unit 90 is in contact with the tablet computer 2. The heating unit 90 includes an electric heating plate 40 which is connected to the battery 35. When power of the battery 35 is transferred to the electric heating plate 40, the electric heating plate 40 will generate heat power and then transfers the power to the tablet computer 2 for heating it so that the tablet computer 2 is retained in proper temperature and thus it can work in normal.

Figure 5:
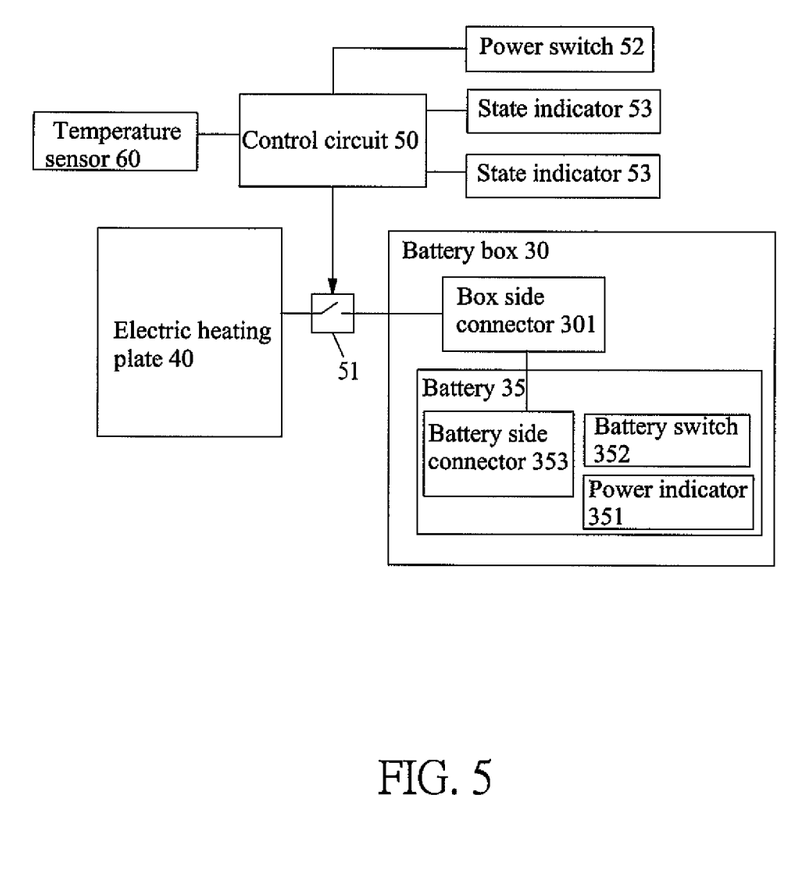
FIG. 5 is a schematic view showing the control structure of the present invention.

A control circuit 50 is installed within the casing 1. As illustrated in FIG. 5, the electric heating plate 40 is connected to the battery 35 through a control switch 51. The control circuit 50 is connected to the control switch 51. The control circuit 50 serves to control the control switch 51 for opening or closing current flowing between the battery 35 and the electric heating plate 40 so as to control the heat generation of the electric heating plate 40. Therefore, the control circuit 50 can control the temperature of the electric heating plate 40. The battery 35 includes a box side connector 301 and the battery 35 includes a battery side connector 353 which is connected to the box side connector 301. The box side connector 301 is connected to the electric heating plate 40 through the control switch 51.

A temperature sensor 60 is installed within the casing 1 and connected to the control circuit 50. The temperature sensor 60 serves to sense the temperature of the tablet computer 2 and transfers detected temperature to the control circuit 50. When the detected temperature is lower than a set temperature, the control circuit 50 opens the control switch 51 to actuate the electric heating plate 40 for heating the tablet computer 2. In this example, the set temperature is between 15~25 degree C.

Another side of the heating unit 90 is in contact with the battery box 30 which is heat conductive. Hence, when the electric heating plate 40 generates heat, the heat can be transferred to the battery box 30 for heating it so that the battery 35 is operated in a proper temperature.

By aforementioned connection of the elements of the present invention, when environmental temperature is lower than a set one, the control circuit 50 will actuate the electric heating plate 40 for heating the tablet computer 2 and the battery 35 so as to prevent that the electric heating plate 40 and the battery 35 cannot operate in normal.

Figure 6:
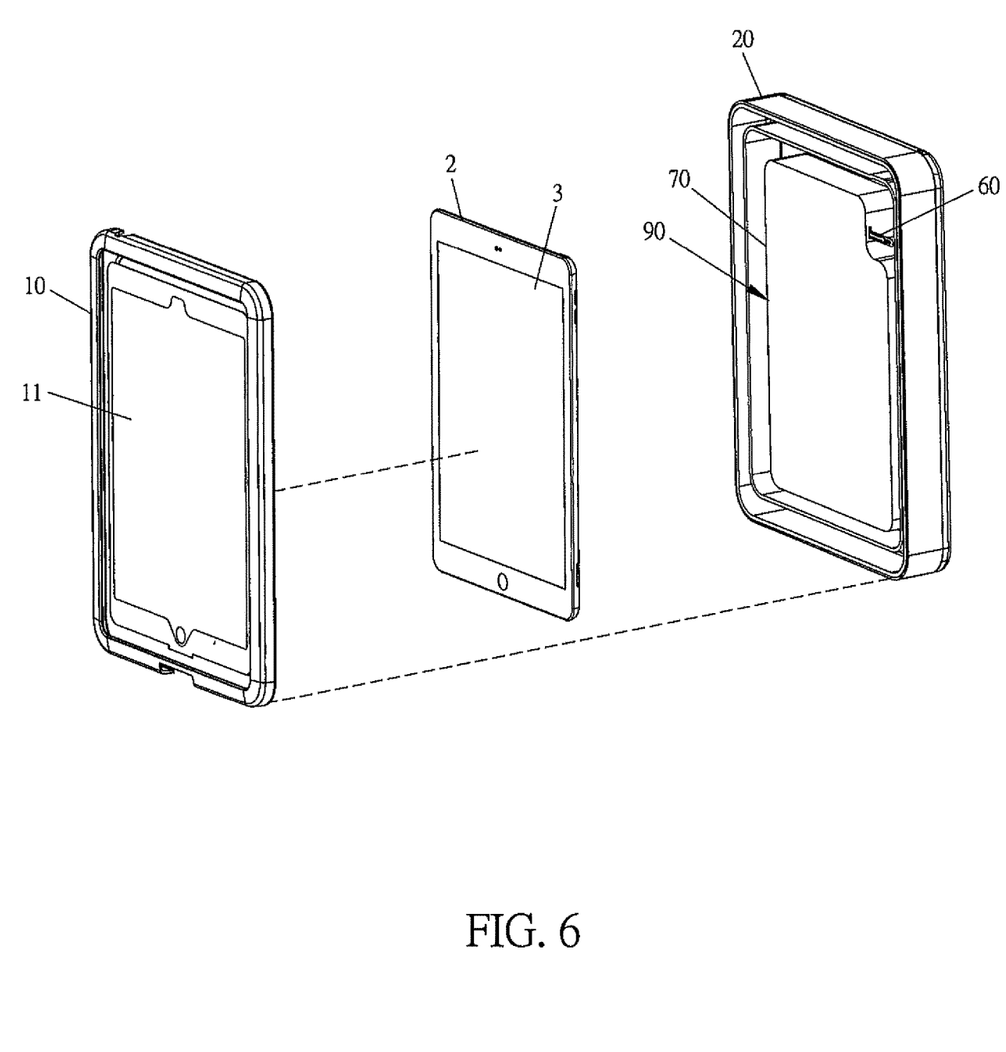
FIG. 6 is an exploded schematic view showing the front cover and back cover of the present invention, where the mask is placed within the back cover.

With reference to FIGS. 3 and 6, the heating unit 90 has a mask 70 which is heat conductive. The mask 70 is installed within the back cover 20 and encloses the battery box 30, the electric heating plate 40 and the control circuit 50. An outer side of the mask 70 is in contact to the tablet computer 2. An inner side of the mask 70 is in contact to the electric heating plate 40. The mask 70 serves to protects the electric heating plate 40 and the control circuit 50 and increases a heat transfer area of the electric heating plate 40 so as to heat the tablet computer 2. One end of the temperature sensor 60 is at an inner side of the mask 70 and another end thereof protrudes out of the mask.

Figure 10:
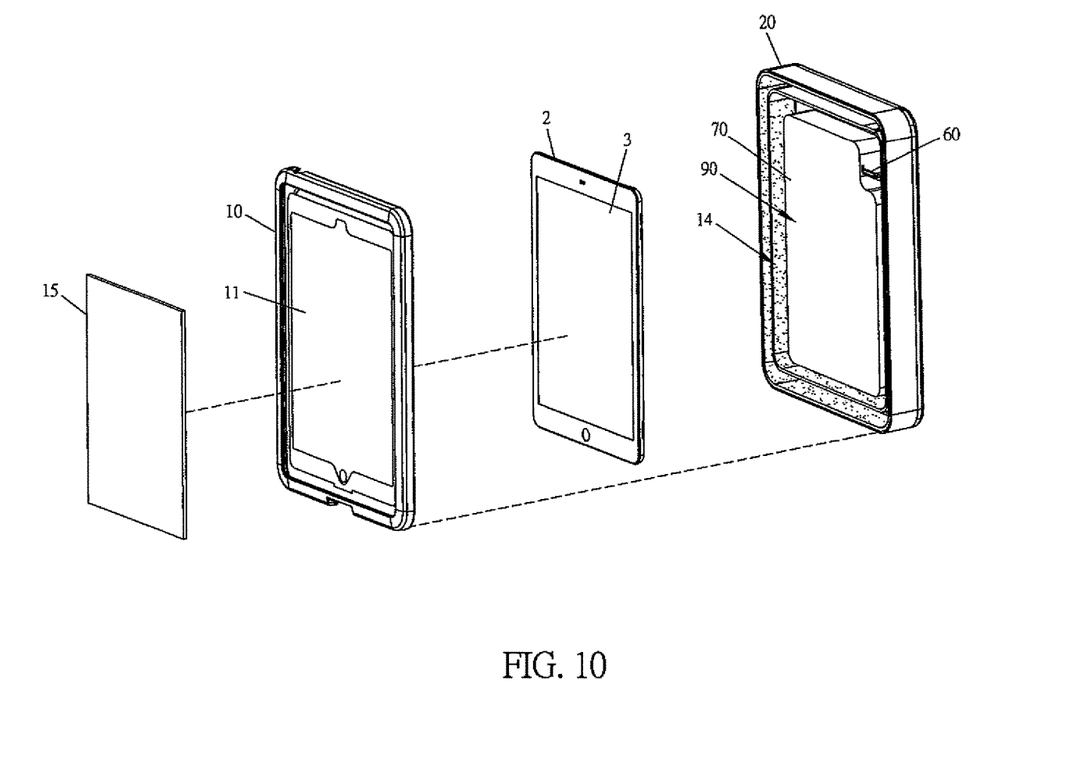
FIG. 10 is an exploded schematic view about the arrangement of heat isolation material of the present invention.

As referring to FIG. 10, preferably, interiors of the casing 1 and transparent portion 11 are arranged with heat isolation sheets 14, 15 for preventing heat from transferring out of the casing 1 and the transparent portion 11. However, arrangements in the drawings are only examples of the present invention, which are not used to confine the scope of the present invention. Any material or objects arranged on the interiors of the casing 1 and the transparent portions 11 are within the scope of the present invention.

The heating unit 90 further includes a heat expansion plate 80 which is heat conductive. One side of the heat expansion plate 80 is adhered to the electric heating plate 40 and another side thereof is adhered to the battery box 30. An area of the heat expansion plate 80 is larger than that of the electric heating plate 40 for increasing heat transfer area between the electric heating plate 40 and the battery box 30 so as to promote heat efficiency of the electric heating plate 40 with respect to the battery box 30.

An inner periphery of the opening 31 of the battery box 30 is installed with a waterproof ring 311 for tightly sealing a gap between the outer cover 32 and the battery box 30 so as to form a waterproof structure to prevent external liquid from flowing into the battery box 30.

Figure 8:
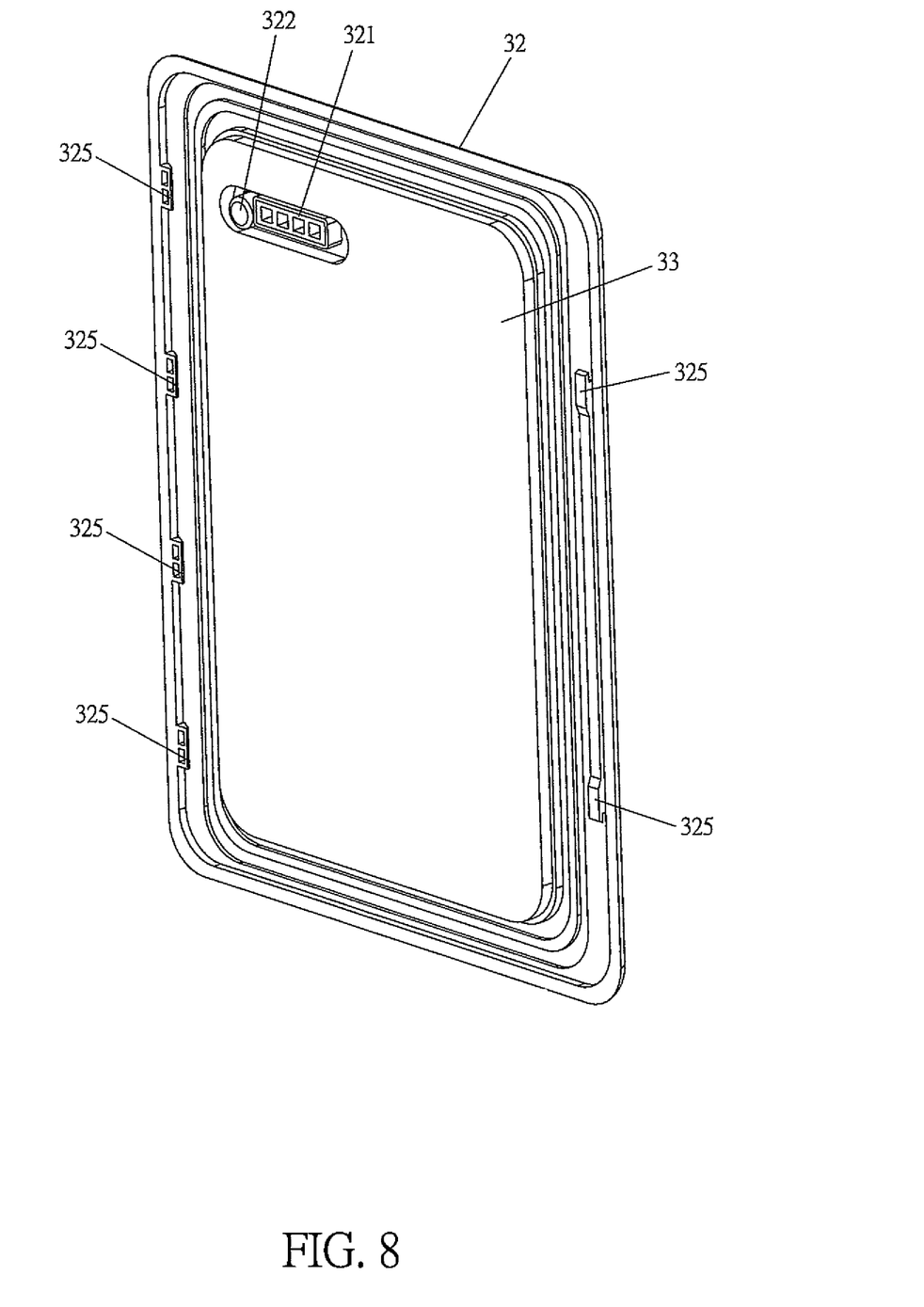
FIG. 8 is a schematic view of the outer cover of the present invention.

With reference to FIGS. 7 and 8, the battery box 30 has a plurality of buckles 305 which are used to buckle respective buckles 325 of the outer cover 32 for fixing the outer cover 32 to the opening 31 of the battery box 30. Each of the buckles 305 of the battery box 30 includes a movable buckling portion 306. Movement of the buckling portion 306 serves to buckle or release the outer cover 32.

An outer side of the casing 1 is arranged with a power switch 52 and at least one state indicator 53. The power switch 52 is connected to the control circuit 50 for actuating or closing the control circuit 50 and the conduction of the battery 35 for controlling actuation or closing of the heating unit 90. The state indicator 53 is connected to the control circuit 50 and the battery 35 for displaying operation of the battery 35 and heat state of the control circuit 50 controlling the electric heating plate 40.

Figure 9:
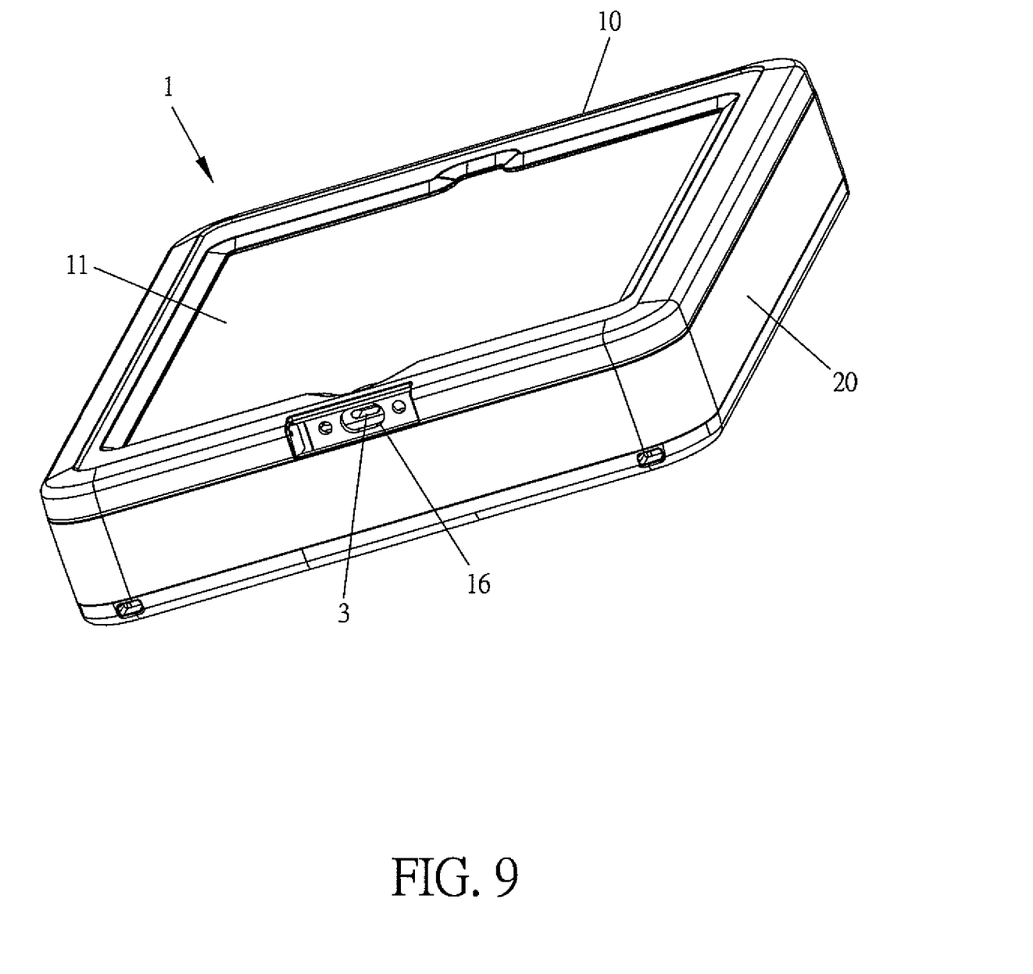
FIG. 9 is a schematic view showing the element of the present invention, which is viewed from another side.

Referring to FIGS. 1 and 9, the front cover 10 is formed with at least one interfacing hole 13. Each hole 13 is positioned corresponding to a corresponding joint of the tablet computer 2. Hence, the user may insert a connecting wire (not shown) to pass through the interfacing hole 13 to be connected to the joint 3 of the tablet computer 2.

Advantages of the present invention are that the electric heating plate, the temperature sensor and the battery are integrated to the protecting casing of the tablet computer. When the temperature sensor detects that the temperature of the tablet computer is lower than a set value, the control circuit will actuate the electric heating plate to heat the tablet computer. As a result, the tablet computer and the battery can be operated in proper temperature for avoiding the tablet computer not to operate due to too lower temperature. Therefore, by using the protection casing of the present invention, the tablet computer can operate even in lower temperature environment. In the present invention, the electric heating plate, the temperature sensor and the battery are integrated to the protecting casing of the tablet computer so as to have an optimum heating efficiency. Furthermore, the structure of the present invention is portable easily. Moreover, a heat switch is arranged to cause that the present invention is used conveniently. Users do not need to further equip extra heating devices. The overall costs are down.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An electronic device protecting casing with heating function, comprising:
    a casing for receiving a tablet computer therein; the casing including a front cover and a back cover; the front cover being combined with the back cover, the tablet computer being received therein;
    a battery box located within the casing; an interior of the battery box being arranged with a battery, a rear side of the battery box exposes out of an outer side of the back cover; a back side of the battery box being formed with an opening for receiving the battery;
    an outer cover serving to seal the opening; an inner side of the outer cover being formed with a heat isolation sheet for preventing heat generated the battery from escape;
    a heating unit being installed within the casing for heating the tablet computer; one side of the heating unit being in contact with the tablet computer; the heating unit including an electric heating plate which is connected to the battery; when power of the battery is transferred to the electric heating plate, the electric heating plate generates heat power and then transfers the power to the tablet computer for heating it; and
    a control circuit installed within the casing; the electric heating plate is connected to the battery through a control switch; the control circuit is connected to the control switch; the control circuit serves to control the control switch for opening or closing current flowing between the battery and the electric heating plate so as to control the heat generation of the electric heating plate; therefore, the control circuit can control temperature of the electric heating plate.

2. The electronic device protecting casing with heating function as claimed in claim 1, wherein the battery includes a box side connector and a battery side connector which is connected to the box side connector; and the box side connector is connected to the electric heating plate through the control switch.

3. The electronic device protecting casing with heating function as claimed in claim 1, wherein a back side of the battery is installed with a power indicator and a battery switch; the power indicator serves to show the power level of the battery; and the battery switch serves to open or close the power indicator.

4. The electronic device protecting casing with heating function as claimed in claim 1, wherein the outer cover is formed with a light transparent portion at a position corresponding to that of the power indicator; the outer cover is arranged with an outer cover switch at a position corresponding to that of the battery switch; therefore, a user may view the power indicator of the battery through the light transparent portion and press the battery switch through the outer cover switch.

5. The electronic device protecting casing with heating function as claimed in claim 1, wherein the front cover is formed with a transparent portion which is corresponding to a position of a screen of the tablet computer so that a user can view the screen.

6. The electronic device protecting casing with heating function as claimed in claim 1, wherein a temperature sensor is installed within the casing and connected to the control circuit; the temperature sensor serves to detect temperature of the tablet computer and transfers detected temperature to the control circuit; when the detected temperature is lower than a set temperature, the control circuit opens the control switch to actuate the electric heating plate for heating the tablet computer.

7. The electronic device protecting casing as claimed in claim 6, wherein the set temperature is between 15~25 degree C.

8. The electronic device protecting casing with heating function as claimed in claim 1, wherein another side of the heating unit is in contact with the battery box which is heat conductive; hence, when the electric heating plate generates heat, the heat is transferred to the battery box.

9. The electronic device protecting casing with heating function as claimed in claim 1, wherein when environmental temperature is lower than a set one, the control circuit will actuate the electric heating plate for heating the tablet computer and the battery so as to prevent that the electric heating plate and the battery cannot operate.

10. The electronic device protecting casing with heating function as claimed in claim 1, wherein the heating unit has a heat conductive mask; the mask is installed within the back cover and encloses the battery box, the electric heating plate and the control circuit; an outer side of the mask is in contact to the tablet computer; an inner side of the mask is in contact to the electric heating plate; the mask serves to protects the electric heating plate and the control circuit and increases a heat transfer area of the electric heating plate.

11. The electronic device protecting casing with heating function as claimed in claim 1, wherein interiors of the casing and transparent portion are arranged with heat isolation sheets for preventing heat from transferring out of the casing and the transparent portion.

12. The electronic device protecting casing with heating function as claimed in claim 1, wherein the heating unit further includes a heat expansion plate which is heat conductive; one side of the heat expansion plate is adhered to the electric heating plate and another side thereof is adhered to the battery box; an area of the heat expansion plate is larger than that of the electric heating plate for increasing heat transfer area between the electric heating plate and the battery box.

13. The electronic device protecting casing with heating function as claimed in claim 1, wherein an inner periphery of the opening of the battery box is installed with a waterproof ring for tightly sealing a gap between the outer cover and the battery box.

14. The electronic device protecting casing with heating function as claimed in claim 1, wherein an outer side of the casing is arranged with a power switch and at least one state indicator; the power switch is connected to the control circuit for actuating or closing the control circuit and the conduction of the battery for controlling actuation or closing of the heating unit.

15. The electronic device protecting casing with heating function as claimed in claim 11, wherein the state indicator is connected to the control circuit and the battery for displaying operation of the battery and heat state of the control circuit controlling the electric heating plate.

16. The electronic device protecting casing with heating function as claimed in claim 1, wherein the front cover is formed with at least one interfacing hole; each hole is positioned corresponding to a corresponding joint of the tablet computer.

* * * * *